United States Patent [19]

Fischer, Werner

[11] Patent Number: 5,045,786
[45] Date of Patent: Sep. 3, 1991

[54] CIRCUIT FOR MEASURING A VARIABLE INDUCTANCE CONNECTED IN SERIES WITH A FIXED INDUCTANCE

[75] Inventor: Fischer, Werner, Ditzingen, Fed. Rep. of Germany

[73] Assignee: Robert Bosch GmbH, Stuttgart, Fed. Rep. of Germany

[21] Appl. No.: 449,892

[22] PCT Filed: May 5, 1988

[86] PCT No.: PCT/EP88/00376
§ 371 Date: Dec. 4, 1989
§ 102(e) Date: Dec. 4, 1989

[87] PCT Pub. No.: WO89/11105
PCT Pub. Date: Nov. 16, 1989

[51] Int. Cl.⁵ .................. G01R 27/26; G01B 7/14
[52] U.S. Cl. .................. 324/207.16; 324/207.19; 324/234; 324/654; 324/657
[58] Field of Search ............ 324/207.16, 207.18, 324/207.19, 234, 238, 648, 654, 656, 657, 725

[56] References Cited

U.S. PATENT DOCUMENTS

| | | | |
|---|---|---|---|
| 3,491,289 | 1/1970 | Petrini | 324/207.16 |
| 3,684,961 | 8/1972 | Muir | 324/207.19 X |
| 4,050,011 | 9/1977 | Mori et al. | 324/238 |
| 4,095,181 | 6/1978 | Harris et al. | 324/238 |
| 4,667,158 | 5/1987 | Redlich | 324/207.19 |

Primary Examiner—Gerard R. Strecker
Attorney, Agent, or Firm—Michael J. Striker

[57] ABSTRACT

An oscillator (10) supplies via a first feeding path a fixed frequency signal to the fixed inductance ($L_o$) connected in series with a variable inductance (L). The signal at the common connection point of the two inductors (RW1) is used to provide an output signal ($U_{act}$) and a control voltage (V) for controlling the amplification of an inverting amplifier (B3) in a second feeding path from the variable oscillator (10) to the inductance (L). The signal from the common terminal (RW1) is processed in a differential amplifier (30) and an amplification control circuit (40) comprising a rectifier (B4, S), a delay element (VZ1), an integrator (I) and a sample-and-hold circuit (S & H) controlled by a synchronization output of the oscillator stage (20). The controllable amplifier (B3) is the part of a multiplier (50), which may comprise analogue or digital components.

7 Claims, 2 Drawing Sheets

CIRCUIT FOR MEASURING A VARIABLE INDUCTANCE CONNECTED IN SERIES WITH A FIXED INDUCTANCE

The present invention relates to a circuit for measuring a variable inductance and in particular the variable inductance of an inductive displacement transducer. Circuits associated with such transducers are disclosed in, for example, DE-A-2924093 and DE-A-3119162.

In existing circuits a number of problems arise. For example low pass output filters are required which introduce unwanted phase shifts. In addition, there are often stability problems.

The present invention seeks to overcome or reduce at least one of the above problems.

According to the present invention there is provided an inductance evaluating circuit comprising an oscillator for generating a signal having a stable frequency, a series connection of a known fixed inductance and a variable inductance, signal-processing means connected to the common connection point of the two inductances to provide an output signal representative of the value of the variable inductance, the oscillator signal is processed into two signals having the same frequency at opposite phase, and being supplied by two feeding paths to the ends of the inductances remote from the common connection point, and one of the feeding paths incorporating a controllable signal amplifying device for controlling the amplitude of the oscillator signal according to output of the signal-processing means.

The above circuit has the following advantages: It provides an output signal with a low residual ripple so that a low frequency filter is not required. There are no problems with stability, the circuit is not sensitive to phase shifts and there are only a few component sub-assemblies which affect the accuracy of the circuit.

When used in connection with an inductive displacement transducer, high-resolution measurement may be achieved. The displacement may be converted by the transducer into an inductance ratio L/Lo which is proportional to displacement and is then converted by the signal-processing circuit into an electric output signal which may take any desired form, e.g. an analogue signal, a binary value or a mark/space ratio.

In a preferred embodiment the signal-processing means comprises an amplification control circuit comprising means for rectifying the signal from the common connection point, and means for integrating the output of the rectifying means. The rectifying means may comprise a switch which is switchable by a synchronising output derived from the oscillator signal to receive an input signal directly or via inverting means. The amplification control circuit may further comprise a delay element between the rectifying means and the integrating means, and the output of the integrating means may be supplied to a sample-and-hold circuit the operation of which is controlled by the synchronising output derived from the oscillator signal or from timing signal generating means which also control the oscillator.

Such a control circuit provides both the output signal $U_{act}$ of the whole circuit and a control signal V for ensuring that changes in the value of inductance L are quickly and accurately followed and that any errors are quickly corrected.

In a preferred embodiment, between the common connection point and the amplification control circuit there is connected a circuit for matching the signal at the common connection point to a reference d.c. voltage level. The matching circuit is preferably constituted by a differential amplifier circuit. This has the advantage of compensating any offset voltages present.

A voltage divider may be connected between the oscillator and the input of the differential amplifier circuit. This has the advantage of detecting any breaks in a cable or a short-circuiting to ground of the common connection point.

A preferred embodiment of the present invention will now be described, by way of example only, with reference to the accompanying drawings, of which:

Figure 1:
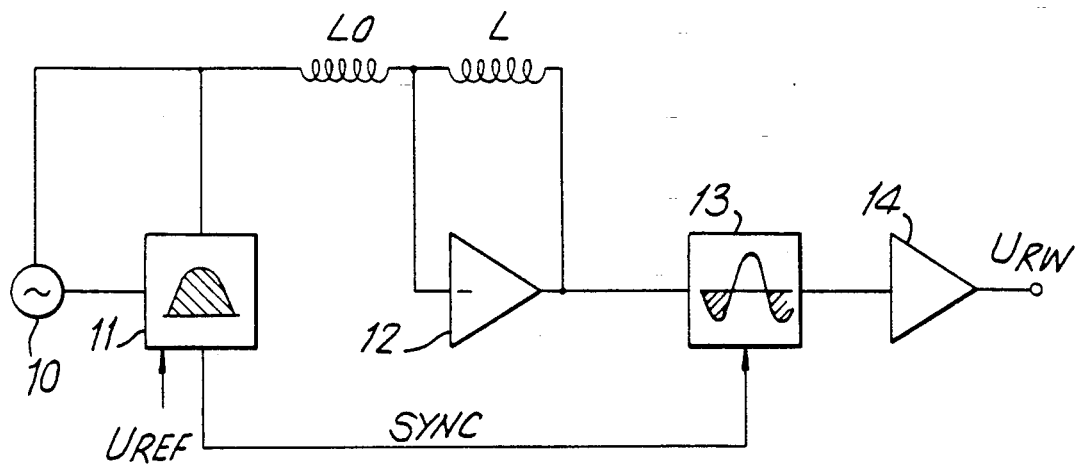
FIG. 1 is a circuit diagram of a prior art arrangement.

Referring now to FIG. 1, there is shown a prior art circuit comprising an oscillator 10, a half-wave control device 11, which supplies a synchronising input to a half-wave rectifier 13, and an output drive stage 14. The common connecting point of a fixed inductance Lo and a variable inductance L is connected to an inverting amplifier 12, the output of which is supplied to the half-wave rectifier 13 to produce an output $U_{RW}$ which represents the value of the variable inductance.

Figure 2:
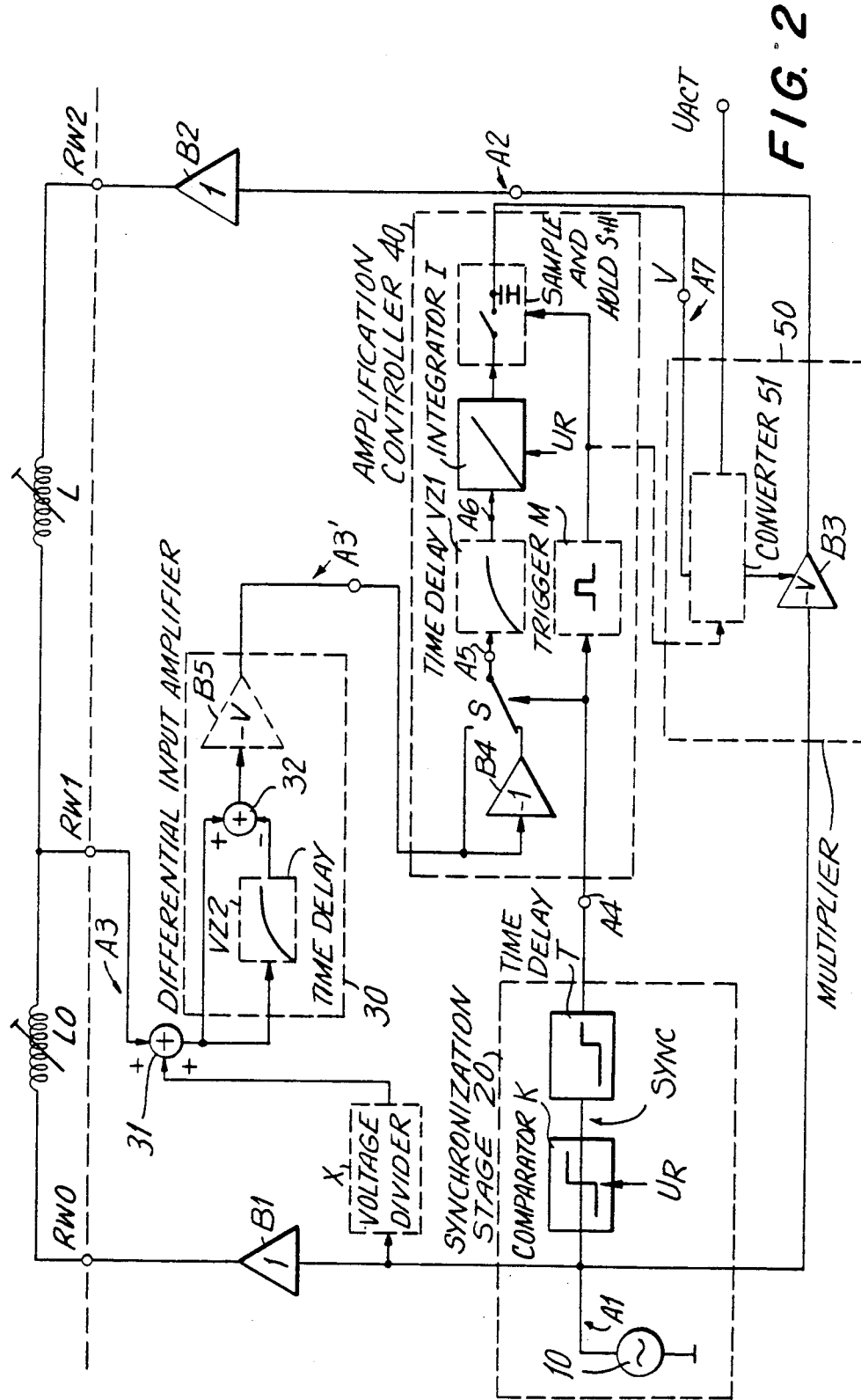
FIG. 2 is a circuit diagram of an arrangement in accordance with the present invention.

Referring now to FIG. 2 there is shown an arrangement in accordance with the present invention comprising an oscillator stage 20 which comprises a sine-wave oscillator 10 and a synchronising output signal A1 stage. The output of the oscillator is shown at A1 in FIG. 3. The signal A1 is supplied directly to a first impedance transformer B1 and then to a terminal RW0 connected to a first end of fixed inductance Lo. The signal A1 is also supplied to a multiplier 50 where it is inverted into a signal A2 which is applied via a second impedance transformer B2 to a terminal RW2 connected to a first end of the variable inductance L. The impedance transformers B1 and B2 supply the sinusoidal oscillations A1 and A2 to the inductances with low resistance and without retroactive effect. The oscillator output signal A1 is also supplied to the synchronisation stage 20 which comprises a comparator K and a dead-time delay member T. The "sync" signal is delayed by the dead-time delay member T, to compensate the phase shift of the signals A1 and A2 at terminals RW0 and RW2 relative to a resulting signal A3 at terminal RW1. The synchronising signal A4 at the output of the stage 20 is shown at A4 in FIG. 3.

The connection between the oscillator output and the impedance transformer B2 is via a controllable, inverting amplifier B3, which forms part of a multiplier circuit 50. The output signal A2 of amplifier B3 is shown at A2 in FIG. 3.

When the ratio of the amplitude of the signal A2 at terminal RW2 to the amplitude of the signal A1 at terminal RW0 is exactly equal to $L/L_o$, there is balance, and the amplitude of signal A3 at terminal RW1 becomes zero. This corresponds to the signals shown in the centre column BALANCED of FIG. 3.

Figure 3:
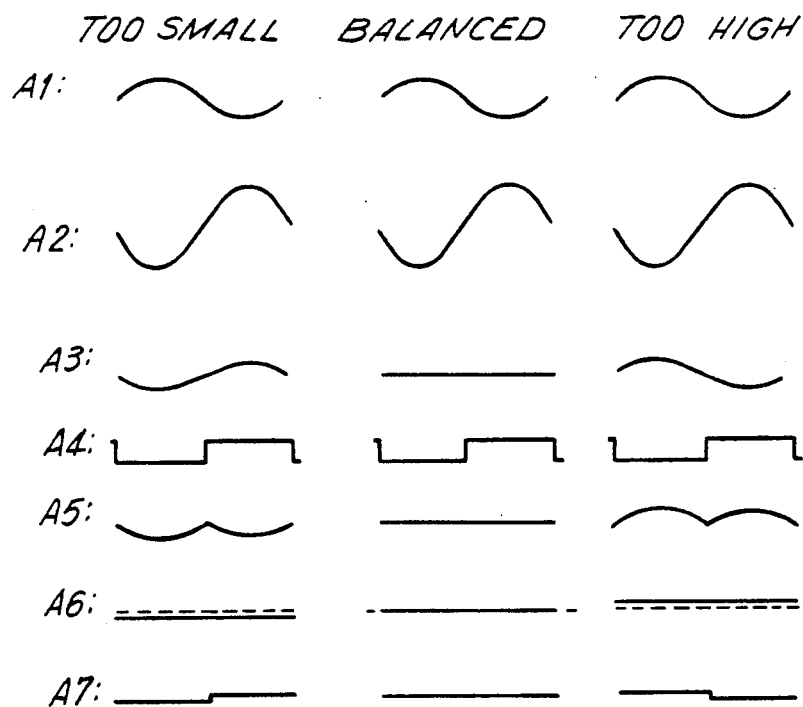
FIG. 3 is a signal diagram indicating the signals occurring at various locations within the circuit of FIG. 2.

If, however, the ratio $$\frac{A_1}{A_2} \neq \frac{L_o}{L}$$

a corresponding amplitude appears at RW1 (see left or right columns of FIG. 3). By means of a differential input amplifier 30 connected to terminal RW1, the amplitude of the signal A3 is adjusted so that the average voltage value at measuring point A3' corresponds to a given reference voltage $U_R$. Amplifier 30 comprises an adder circuit 32, a plus input of which receives the signal A3 from terminal RW1, and a minus input of which receives an output signal from a delay member VZ2 the input of which is also connected to receive the signal A3 from terminal RW1. The output signal of adder 32 is supplied via an inverting amplifier B5 to measuring point A3' which is connected to a contact of an analogue switch S and the input of an analogue inverter B4. The switch S and the inverter B4 form together rectifying means provided at the input of an amplification controller 40.

If an A.C. signal is present at measuring point A3', it is rectified with respect to the given d.c. reference voltage $U_R$ by means of the analogue inverter B4 and the analogue switch S whose other contact is connected to the output of B4. The phase corrected signal A4 serves for synchronisation of the rectification process and changes over the switch S at each zero-crossing point of the oscillator signal A1 with the reference voltage level $U_R$. The output of switch S is indicated at A5 in FIG. 3.

The rectified signal A5 is then filtered by delay element VZ1 and the part of the resulting signal A6 which exceeds the reference voltage level $U_R$ is integrated at integrator.

The deviation from $U_R$ of the average value of the signal A6 is proportional to the difference of the actual amplitude of the signal A2 at RW2 relative to a stabilized amplitude of the signal A2 at RW2; by means of the integration of this deviation there is obtained a tracking control value. This control value is quantised in time by a sample-and-hold circuit S & H which is controlled by a monostable trigger M connected to the synchronizing signal A4. The control voltage V of the signal A7 at the output of the S&H circuit, illustrated in, see line A7 in FIG. 3, controls the amplification of the controllable amplifier B3 via a converter 51 within multiplier 50. The signal $U_{act}$ representative of the value of the variable inductance L, is obtained at the output of converter 51.

Finally, to detect a break in a cable or short circuiting to ground of the signal A3 at RW1, there is provided a voltage divider X which is connected to the output of oscillator 10 to provide a divided-down sine-wave which is added in adder circuit 31 to the signal A3 from terminal RW1.

Various modifications may be made to the above described arrangement. For example, the implementation of the converter 51 and the amplifier B3 is dependent upon the desired form of the output signal $U_{act}$ and upon the required accuracy. As described an analogue signal is produced by an analogue multiplier. The multiplier may comprise an operational transconductance amplifier. Alternatively a 10-Bit word output could be obtained from an A/D converter 51 and an amplifier B3 with a digitally determined amplification factor. The output signal could also be in the form of a signal with a variable mark/space ratio. If desired, a timing input may be provided to the converter 51 from the monostable trigger M, as shown by a broken line in FIG. 2. FIG. 2 shows a preferred embodiment of the present invention and various can be omitted if desired such as, for example the differential amplifier 30, the voltage divider X, the delay element VZ1, the sample and hold circuit S & H, the monostable trigger M of the amplification controller 40, and the converter 51.

If desired the control amplifier B3 could be alternatively connected in the path from oscillator 10 to the fixed inductance Lo.

Instead of the synchronising output being derived from the oscillator 10, it may be derived from a common timing signal generating means which also controls oscillator 10. In a further modification, the controllable amplifier B3 is replaced by an amplitude-controllable oscillator which is also connected to the common timing signal generating means.

I claim:

1. A circuit for evaluating a variable inductance (L) connected in series with a fixed inductance (L0), comprising:
   a signal generator (10) for generating a first signal (A1) having a fixed frequency and a fixed amplitude;
   a first path for feeding said first signal to a free end (RW0) of said fixed inductance;
   a controllable inverting amplifier (B3) connected with said signal generator to invert said first signal into a second signal having said fixed frequency at opposite phase and being controllable as to its amplitude;
   a second feeding path for applying said second signal to a free end (RW2) of said variable inductance;
   means for processing a third signal resulting at a common connection point of said fixed and variable inductances, said processing means including a matching circuit having an input connected to said common connection point to adjust said third signal (A3) toward a level of a d.c. reference voltage, an amplification control circuit including controllable rectifying means connected to an output of said matching circuit, integrating means connected with said rectifying means to integrate into a control value a deviation from the d.c. reference voltage of a rectified signal (A6) at the output of said rectifying means, means for quantizing said control value into a control signal (A7) applied to a control input of said controllable inverting amplifier (B3); and means for converting said control signal into an output signal ($U_{act}$) representative of a value of said variable inductance when said third signal (A3) is balanced to zero.

2. A circuit according to claim 1, comprising a synchronizing stage connected between said signal generator and said reference voltage source to generate a synchronizing signal derived from said first signal.

3. A circuit according to claim 2, wherein said rectifying means comprises a switch which is switchable by said synchronizing signal to pass the third signal (A3') at the output of said matching circuit either directly or via inverting means (B4).

4. A circuit according to claim 3, wherein the amplification control circuit (40) further comprises a delay element (VZ1) between the rectifying means and the integrating means, and wherein the output of the integrating means is supplied to a sample-and-hold circuit (S & H), the operation of which is controlled by said synchronising signal derived from the first signal.

5. A circuit according to claim 1, wherein the matching circuit is a differential amplifier circuit (30) and a voltage divider (X) is connected between the signal generator (10) and an input of the differential amplifier circuit.

6. A circuit according to claim 1 wherein the two inductances (L, $L_o$) are part of an inductive displacement transducer.

7. A circuit according to claim 1, wherein said control signal adjusts the amplitude of said second signal to a value at which said third signal approaches zero value.

* * * * *